United States Patent [19]

Hunter et al.

[11] Patent Number: 4,631,803
[45] Date of Patent: Dec. 30, 1986

[54] METHOD OF FABRICATING DEFECT FREE TRENCH ISOLATION DEVICES

[75] Inventors: William R. Hunter, Garland; Christopher Slawinski, Austin; Clarence W. Teng, Plano, all of Tex.

[73] Assignee: Texas Instruments Incorporated, Dallas, Tex.

[21] Appl. No.: 701,465

[22] Filed: Feb. 14, 1985

[51] Int. Cl.[4] .................. H01L 21/302; H01L 21/76
[52] U.S. Cl. .................. 29/576 W; 29/578; 29/580; 148/175; 148/DIG. 50; 148/DIG. 85; 148/DIG. 117; 156/643; 156/653; 156/657; 357/50
[58] Field of Search ............ 29/576 W, 578, 580; 148/175, DIG. 50, 85, DIG. 117; 156/643, 653, 657; 357/50

[56] References Cited

U.S. PATENT DOCUMENTS

| | | | |
|---|---|---|---|
| 4,079,506 | 3/1978 | Suzuki et al. | 148/DIG. 97 |
| 4,396,460 | 8/1983 | Tamaki et al. | 29/576 W |
| 4,502,914 | 3/1985 | Trumpp et al. | 29/576 W |
| 4,519,128 | 5/1985 | Chesebro et al. | 29/578 X |
| 4,528,047 | 7/1985 | Beyer et al. | 29/578 X |
| 4,546,538 | 10/1985 | Suzuki | 29/578 X |

FOREIGN PATENT DOCUMENTS

| | | | |
|---|---|---|---|
| 56-157044 | 12/1981 | Japan | 29/576 W |
| 57-113250 | 7/1982 | Japan | 29/576 W |
| 59-84435 | 5/1984 | Japan | 29/576 W |
| 8200782 | 9/1983 | Netherlands | 29/576 W |

Primary Examiner—William G. Saba
Attorney, Agent, or Firm—Robert Groover; Melvin Sharp; N. Rhys Merrett

[57] ABSTRACT

The specification discloses an isolation trench (36) formed in a semiconductor body. A stress relief layer (38) of oxide is formed on the interior walls of the trench (36), the layer (38) being sufficiently thin to prevent stressing of the lower corners of the trench (36). A masking layer (40) of nitride is formed over the layer (38). An isolation body (42) of oxide or polysilicon then refills the remainder of the trench and a cap oxide (43) and layer (44) of field oxide is formed over the semiconductor body and the filled trench.

14 Claims, 3 Drawing Figures

METHOD OF FABRICATING DEFECT FREE TRENCH ISOLATION DEVICES

TECHNICAL FIELD OF THE INVENTION

This invention relates to semiconductor devices and to methods of fabrication thereof, and more particularly relates to trench isolation structures and the method of forming.

BACKGROUND OF THE INVENTION

It has heretofore been known to use trench isolation to improve the oxide isolation scalability in bipolar processes. For example, reference is made to the article entitled, "U-Groove Isolation Technology for High Density Bipolar LSI's", Jap. J. Appl. Phys., 21, Suppl. 21-1, pp. 37-40, 1981, by Y. Tamaki, et al. In addition, trench isolation has been used in the manufacture of MOS devices, as described in such articles as "Trench Isolation Technology for MOS Applications", Proc of the First International Symposium on VLSI Science and Technology, pp. 339-346, 1982, by S. Y. Chiang, et al. Further, trench isolation has been advantageously used to suppress latch-up in bulk CMOS devices, as reported in such articles as "Deep Trench Isolated CMOS Devices", IEDM Tech. Dig., pp. 237-240, 1982, by R. D. Rung, et al.

Isolation trenches have conventionally been fabricated by the etching of deep, narrow trenches located to separate such areas as PMOS and NMOS regions. The sidewalls of previously developed trenches have then been oxidized to provide dielectric isolation and the trench refilled with a conformal undoped polysilicon deposition, which is planarized to leave polysilicon only inside the trench. Finally, a field oxide is grown on top of the trench and field regions to cap the polysilicon and to provide transistor-to-transistor isolation.

While previously developed trench isolation processes have provided improvements in oxide isolation scalability and in the suppression of latch-up, problems have occurred due to dislocations formed in the semiconductor body during the fabrication of the trench. These defects or dislocation of the semiconductor material allow high leakage current detrimental to semiconductor devices. A need has thus arisen for a trench structure and a method of fabrication which eliminates the formation of defects in the surrounding semiconductor body.

SUMMARY OF THE INVENTION

In accordance with the present invention, a trench structure and method of forming is provided which substantially reduces or eliminates the defects previously associated with prior trench structures.

In accordance with the invention, a method of forming an isolation trench includes forming a trench in a semiconductor body. A stress relief layer of insulating material is formed over the interior walls of the trench, the layer being sufficiently thin to prevent defect generation in the semiconductor body. An oxidation masking layer such as nitride is formed over the layer of insulating material. The remaining area of the trench is then filled with a body of isolation material such as oxide or polysilicon. A layer of field oxide is formed over the semiconductor body and the filled trench in order to provide transistor-to-transitor isolation.

In further accordance with the present invention, a second layer of oxide may be formed over the oxidation masking layer. A second layer of oxidation masking material such as nitride is formed over the second layer of oxide. The trench is then filled with oxide or polysilicon.

In accordance with yet another aspect of the invention, an isolation trench is formed in the semiconductor body. A stress relief layer of insulating material such as oxide is formed on the interior walls of the trench. This stress relief layer may have a thickness in the range of from 200 Å to 450 Å to prevent stressing of the walls of the trench introduced by a subsequent oxidation masking layer. An oxidation masking layer such as nitride is formed over the stress relief layer to prevent undesirable oxidation of surfaces on either side of the oxidation masking layer. An isolation body such as polysilicon fills the remaining area of the trench. A layer of field oxide covers the semiconductor body and the filled trench. Field oxide may be formed at a temperature of above 1000° C. in order to further reduce defect generation.

BRIEF DESCRIPTION OF THE DRAWINGS

For a more detailed description of the present invention and for further objects and advantages thereof, reference is now made to the following description taken in conjunction with the accompanying drawings, in which.

DETAILED DESCRIPTION OF THE INVENTION

Figure 1:
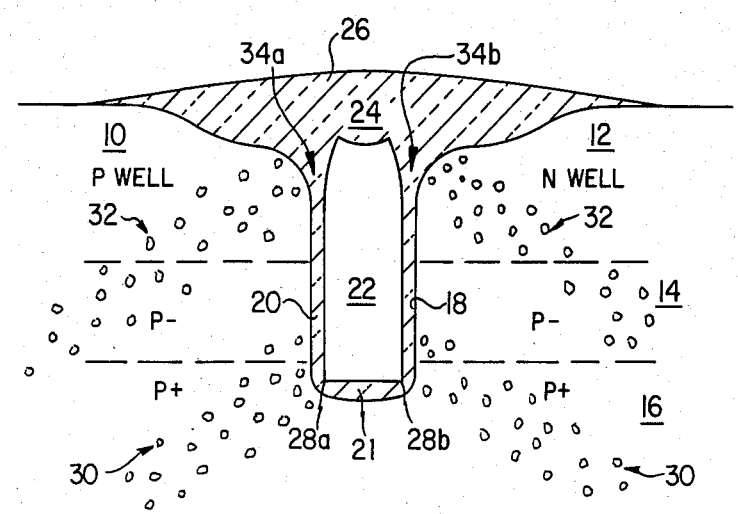
FIG. 1 is a diagrammatic illustration of a prior art isolation trench.

FIG. 1 is a somewhat diagrammatic sectional view of an isolation trench formed in accordance with a prior technique. The trench structure in FIG. 1 is formed in a semiconductor body in order to isolate a P-type well region 10 and an N-type well region 12. The P and N regions are formed over a P− layer 14 and a P+ layer 16 as illustrated. The trench structure includes a relatively deep and narrow trench 18 formed by etching or other techniques. By utilization of conventional selective oxidation, a sidewall oxide 20 is formed only on the sidewalls of trench 18, along with a bottom layer 21. The trench is then refilled with conformal undoped polysilicon 22. The polysilicon is planarized at 24 to leave polysilicon only inside the trench. A layer of field oxide 26 is then grown over the top of the trench 18 and the polysilicon 22.

As may be seen by FIG. 1, the prior technique has often produced defects from several mechanisms. For example, the oxide layers 20 and 21 are often formed with a thickness of from 1500 Å to 2000 Å. This thickness of oxide has been found to create stress at the corners 28a and 28b of trench 18, thereby creating defects or dislocations, generally identified by the numerals 30, which extend in the P− and P+ regions 14 and 16 outwardly from the trench corners. The stress at corners 28a–b is caused by volume expansion during oxidation of the trench corners which tends to squeeze or press against the adjacent substrate 16. The defects 30 may cause excessive current leakage which substantially deteriorates the operational characteristics of the semiconductor device.

Additional defects may be created upon the formation of the field oxide layer 26 over the trench. Nonuniformity of the oxidizing surface, combined with the lack of stress relief of the field oxide grown at 900° C., has been determined to be a source of defects or dislocations in the semiconductor body generally identified by numerals 32. The defects 32 emanate from the upper portion of the trench 18 in contact with field oxide layer 26.

Yet another source of dislocations which occur with prior techniques is the excessive encroachment of oxide on the exposed silicon surfaces on both the P-region 10 and N-region 12, as well as the upper surfaces of the polysilicon 22. This oxidation, in essence, creates a vertical bird's beak identified generally by 34a and 34b. The confinement of the volume expansion associated with the bird's beak oxidation also tends to create the dislocation and defects 32.

Figure 2:
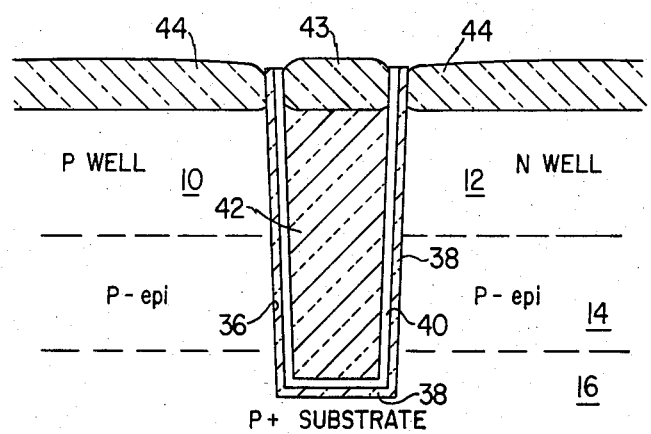
FIG. 2 is a sectional, somewhat diagrammatic view of the preferred embodiment of the present invention.

FIG. 2 illustrates a trench construction which substantially eliminates the formation of defects or dislocations 30 and 32, as well as reducing the formation of the vertical bird's beak structure into the trench. The trench shown in FIG. 2 is initially constructed by forming a trench 36 by etching or other conventional techniques. For example, the etch mask pattern for the trench 36 may be defined in an oxide layer (for example, thermal or CVD oxide) formed on the substrate surface, which is used as a hard mask for an etch and a chlorine-based reactive-ion-etching process with a silicon-to-oxide etch ratio of about 15:1. Trench 36 has dimensions similar to previously developed trenches and may be provided with a depth of from about 3 to 10 microns, depending on epilayer thickness. The width of the trench may range from 0.5 micron to 2.5 microns, depending upon its intended use. After removal of the hard mask, a relatively thin layer of oxide 38 is formed on the inside sidewalls and bottom of the trench 36, as well as over the upper face of regions 10 and 12. The thickness of the oxide layer 38 may range, for example, from 200 Å to 450 Å. It has been found that by forming such a thin layer of oxide, the stresses which heretofore created the defects 30 tend to be eliminated.

A thin oxidation masking layer 40 of nitride is then formed over the entire oxide layer 38 by conventional LPCVD techniques. Oxidation masking layer 40 may have, for example, a thickness of from 300 Å to 600 Å. The nitride layer protects the substrate and the subsequent polysilicon refill from oxidation which is the cause of the vertical bird's beak 34a–b. The nitride layer 40 also tends to reduce electrical cross talk between the P well 10 and N well 12 because of its insulating properties.

The trench 36 is then refilled with thick oxide or undoped polysilicon 42. If refilled with oxide, the upper portion of the oxide 42 is planarized to the silicon surface, the previously applied nitride on the surface of the substrate is stripped, and a thick field oxide layer 44 is grown. If refilled with polysilicon, then a cap oxide 43 may be grown either before field oxide layer 44, or simultaneously with the thick field oxide.

It has been found advantageous to grow the field oxide at temperatures above 1000° C., and preferably at 1050° C., to allow viscous flow of oxide, which tends to provide stress relief and prevents the formation of defects. Moreover, the thin oxide layer 38 and nitride layer 40 eliminate stress at the bottom corners of the trench during the sidewall oxide formation by minimizing confined volume expansion at the trench corners. Stress occurring from vertical bird's beaking at the top corners of the trench is reduced during the field oxidation and cap oxidation with the use of the oxidation masking layers. The present invention has thus been found to form trench isolation structures which are essentially defect-free.

Figure 3:
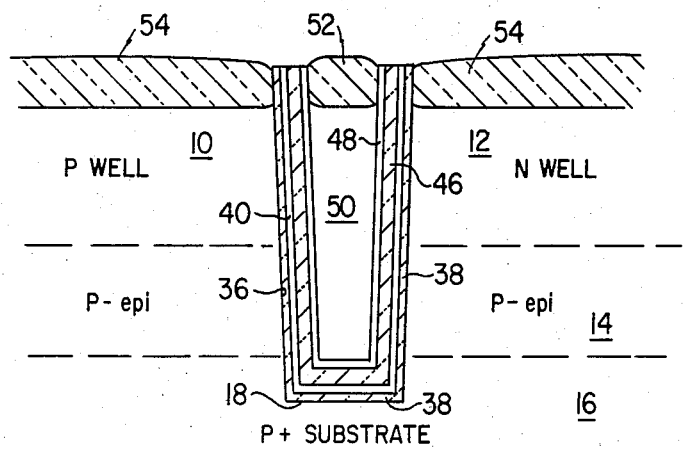
FIG. 3 is a sectional, somewhat diagrammatic illustration of a second embodiment of the present isolation trench invention.

When the trench is refilled with polysilicon, FIG. 3 illustrates another embodiment of the present invention which prevents vertical bird's beaking and also reduces defects, and further reduces electrical cross talk. In this embodiment, wherein like numbers will be utilized for like and corresponding parts of previous Figures, the trench 36 is formed in the manner previously described and is coated with a thin layer of thermal oxide 38 which has a thickness of from 200 Å to 450 Å. A thin layer of nitride 40 is then deposited as previously disclosed and may be provided with a thickness of from 300 Å to 600 Å. A layer 46 of oxide is then formed over the nitride layer and may be provided for example with a thickness of 1000 Å. The oxide layer 46 may be deposited by conventional LPCVD techniques. Due to the nitride layer 40, the oxide layer 46 cannot be grown but must be deposited. Oxide layer 46 serves to increase the dielectric thickness to insulate the polysilicon layer. A second layer of nitride 48 is then formed on top of the oxide layer 46 and may be provided with a thickness of approximately 300 Å.

The remaining portion of the trench is then refilled with polysilicon 50. The polysilicon is planarized even with the semiconductor surface, the nitride, oxide, nitride stack is removed from the substrate surface not inside the trench, and a cap oxide 52 and a thick field oxide 54 is grown, preferably at temperatures above 1000° C. The structure shown in FIG. 3 provides improved cross talk elimination due to the increase of insulator thickness by the addition of oxide 46 and nitride 48. The structure shown in FIG. 3 also provides essentially a defect free trench construction.

It will thus be seen that the present invention discloses a method and device formed thereby wherein defects and resulting current leakage is substantially eliminated. In addition, the present device substantially reduces cross talk. The present techniques also tend to eliminate vertical bird's beak structures which tend to create stress and dislocations.

Although the preferred embodiments have been described in detail, it should be understood that various changes, substitutions and alterations can be made therein without departing from the spirit and scope of the invention as defined by the appended claims.

What is claimed is:

1. A method of forming an isolation trench in a semiconductor device, comprising the steps of:
   forming a trench in a silicon body,
   forming a layer of insulating material over the interior walls of said trench, said layer being sufficiently thin to prevent increase of stress within said trench,
   forming an oxidation masking layer over said layer of insulating material,
   removing said oxidation masking layer from predetermined portions of said silicon body,
   filling the remainder of said trench with a body of oxidizable isolation material, and then
   oxidizing said silicon body to form a layer of field oxide over said predetermined portions of said semiconductor body and the filled trench while simultaneously oxidizing a surface portion of said isolation material, said oxidation masking layer preventing undesirable oxidation and stress within the semiconductor material which might otherwise cause dislocation defects.

2. The method of claim 1, wherein said oxidation masking layer comprises nitride.

3. The method of claim 1, wherein said layer of insulating material comprises silicon oxide.

4. The method of claim 1 wherein said isolation material filling the remaining area of said trench comprises polysilicon.

5. The method of claim 1, further comprising the steps of:
   forming a second layer of insulating material over said oxidation masking layer, and
   forming a second masking layer between said second layer and said body of isolation material.

6. The method of claim 1 wherein said layer of field oxide is formed at a temperature above 1000° C.

7. The method of claim 1 wherein said oxidation masking layer has a thickness of from 300 Å to 600 Å.

8. The method of claim 1 wherein said layer of insulating material has a thickness in the range of approximately 200 Å to 450 Å.

9. A method of forming a defect free isolation trench in a semiconductor device, comprising the steps of:
   forming a trench with generally vertical sidewalls and a bottom in a silicon body,
   forming a layer of oxide over said sidewalls and bottom of said trench said layer of oxide being sufficiently thin to prevent stress in the silicon body,
   forming a layer of nitride over said layer of oxide,
   removing said nitride layer from predetermind portions of said silicon body,
   filling the remainder of said trench with oxidizable isolation material, and then
   oxidizing said silicon body to form a field oxide layer over said semiconductor body and simultaneously oxidizing a surface portion of said isolation material to form an oxide layer thereover.

10. The method of claim 9, and further comprising the steps of:
    forming a second layer of oxide over said layer of nitride, and
    forming a second layer of nitride between said second layer of oxide and said isolation material.

11. The method of claim 9 wherein said isolation material comprises polysilicon.

12. The method of claim 9 wherein said layer of oxide has a thickness in the range of approximately 200 Å to 450 Å.

13. The method of claim 9 wherein said layer of nitride has a thickness of from 300 Å to 600 Å.

14. The method of claim 9 wherein said field oxide is formed at temperatures above 1000° C.

* * * * *